(12) United States Patent
Noda et al.

(10) Patent No.: US 7,163,855 B2
(45) Date of Patent: Jan. 16, 2007

(54) METHOD FOR MANUFACTURING SEMICONDUCTOR DEVICES

(75) Inventors: Takafumi Noda, Shiojiri (JP); Masahiro Hayashi, Sakata (JP); Akihiko Ebina, Fujimi-machi (JP); Masahiko Tsuyuki, Chino (JP)

(73) Assignee: Seiko Epson Corporation (JP)

( * ) Notice: Subject to any disclaimer, the term of this patent is extended or adjusted under 35 U.S.C. 154(b) by 174 days.

(21) Appl. No.: 10/902,699

(22) Filed: Jul. 29, 2004

(65) Prior Publication Data
US 2005/0059196 A1 Mar. 17, 2005

(30) Foreign Application Priority Data
Jul. 31, 2003 (JP) .............................. 2003-283664

(51) Int. Cl.
H01L 21/336 (2006.01)
H01L 21/8238 (2006.01)
H01L 21/8234 (2006.01)

(52) U.S. Cl. ..................... 438/197; 438/216; 438/275; 438/257

(58) Field of Classification Search ................ 438/197, 438/216, 299, 275, 258, 257, 211, 199
See application file for complete search history.

(56) References Cited

U.S. PATENT DOCUMENTS 6,939,757 B1* 9/2005 Kim ............................ 438/199

2004/0256658 A1* 12/2004 Park et al. ................... 257/315

FOREIGN PATENT DOCUMENTS

| JP | 11-026596 | 1/1999 |
|---|---|---|
| JP | 2001-168210 | 6/2001 |
| JP | 2002-170888 | 6/2002 |
| JP | 2002-329862 | 11/2002 |
| JP | 2003-133435 | 5/2003 |

* cited by examiner

Primary Examiner—Chuong Anh Luu
(74) Attorney, Agent, or Firm—Harness, Dickey & Pierce, P.L.C.

(57) ABSTRACT

A semiconductor device manufacturing method is provided including: forming a first impurity layer that becomes first wells in a high breakdown voltage transistor forming region in a semiconductor layer; forming a second impurity layer that becomes offset regions in the high breakdown voltage transistor forming region; forming the first wells and the offset regions by diffusing impurities of the first and second impurity layers by heat treating the semiconductor layer; forming element isolation regions by a trench element isolation method in the semiconductor layer, after forming the first wells and the offset regions; forming first gate dielectric layers in the high breakdown voltage transistor forming region; forming second wells in a low voltage driving transistor forming region in the semiconductor layer; forming second gate dielectric layers in the low voltage driving transistor forming region; and forming gate electrodes in the high breakdown voltage transistor forming region and the low voltage driving transistor forming region.

3 Claims, 20 Drawing Sheets

METHOD FOR MANUFACTURING SEMICONDUCTOR DEVICES

RELATED APPLICATIONS

This application claims priority to Japanese Patent Application No. 2003-283664 filed Jul. 31, 2003 which is hereby expressly incorporated by reference herein in its entirety.

BACKGROUND

1. Technical Field

The present invention relates to semiconductor devices and in particular to a method for manufacturing a semiconductor device having transistors with different drive voltages and/or gate breakdown voltages in a common semiconductor layer.

2. Related Art

As weight-reduction and miniaturization of portable electronic devices have progressed in recent years, research and development to further reduce the size of integrated circuits (ICs) to be mounted on these electronic devices are being conducted. Such technologies include methods that reduce chip areas of ICs through mix-mounting transistors for low voltage operation and high breakdown voltage transistors for high voltage operations on the same substrate (the same chip).

In these instances, a LOCOS method, a semi-recess LOCOS method and a trench element isolation method may be available as methods for isolating elements. In view of reducing the chip areas of ICs, the use of a trench element isolation method may be more preferable than the use of a LOCOS method or a semi-recess LOCOS method.

It is noted that, since high breakdown voltage transistors have deep diffusion layers, heat treatment at a high temperature is necessary to form the diffusion layers. Element isolation regions that are formed by a trench element isolation method are rather weak against heat and stress caused by heat, and are prone to have deformities and defects, compared to element isolation regions formed by a LOCOS method or a semi-recess LOCOS method. For this reason, a LOCOS method or a semi-recess LOCOS method is most commonly used as a method for isolating elements when low voltage driving transistors and high breakdown voltage transistors are mounted together.

It is an object of the present invention to provide a method for manufacturing a semiconductor device having transistors with different gate breakdown voltages and/or drain breakdown voltages in a common semiconductor layer.

SUMMARY

A method for manufacturing a semiconductor device in accordance with the present invention comprises:

a step of forming a first impurity layer that becomes a first well in a high breakdown voltage transistor forming region in a semiconductor layer;

a step of forming a second impurity layer that becomes an offset region in the high breakdown voltage transistor forming region;

a step of forming the first well and the offset region by diffusing impurities of the first and second impurity layers by heat treating the semiconductor layer;

a step of forming an element isolation region by a trench element isolation method in the semiconductor layer, after the step of forming the first well and the offset region;

a step of forming a first gate dielectric layer in the high breakdown voltage transistor forming region;

a step of forming a second well in a low voltage driving transistor forming region in the semiconductor layer;

a step of forming a second gate dielectric layer in the low voltage driving transistor forming region; and a step of forming gate electrodes in the high breakdown voltage transistor forming region and the low voltage driving transistor forming region.

According to the manufacturing method, by conducting a heat treatment on the semiconductor layer before the step of forming the element isolation region by a trench element isolation method, the step of forming the first well and the offset region is conducted through diffusing impurities of the first and second impurity layers. The heat treatment is conducted at a high temperature to provide the first well and the offset region with deep diffusion layers. According to the manufacturing method, after the element isolation region has been formed, a high temperature heat treatment, such as the heat treatment that is necessary to form the first well and the offset region, is not necessary. As a result, heat generated when conducting the heat treatment necessary to form the first well and the offset region and stress caused by the heat are not applied to the element isolation region.

Accordingly, elements can be isolated by an element isolation region with few deformities or defects. In other words, when high breakdown voltage transistors and low voltage driving transistors are mixed and mounted together, element isolation regions with an excellent dielectric property can be formed even by using a trench element isolation method as an element isolation method. Also, by using a trench element isolation method, semiconductor devices can be further miniaturized, compared to the case when element isolation regions are formed by using a LOCOS method or a semi-recess LOCOS method.

In the method for manufacturing a semiconductor device in accordance with the present invention, a step of forming an offset trench dielectric layer in a high breakdown voltage transistor can be the same step as the step of forming the element isolation region.

In the method for manufacturing a semiconductor device in accordance with the present invention, n-type and p-type high breakdown voltage transistors are formed in the high breakdown voltage transistor forming region and n-type and p-type low voltage driving transistors are formed in the low voltage driving transistor forming region.

DETAILED DESCRIPTION

A preferred embodiment of the present invention will be described below with reference to the accompanying drawings.

Semiconductor Device

First, a semiconductor device that can be obtained by a manufacturing method in accordance with an embodiment of the present invention will be described.

Figure 1:
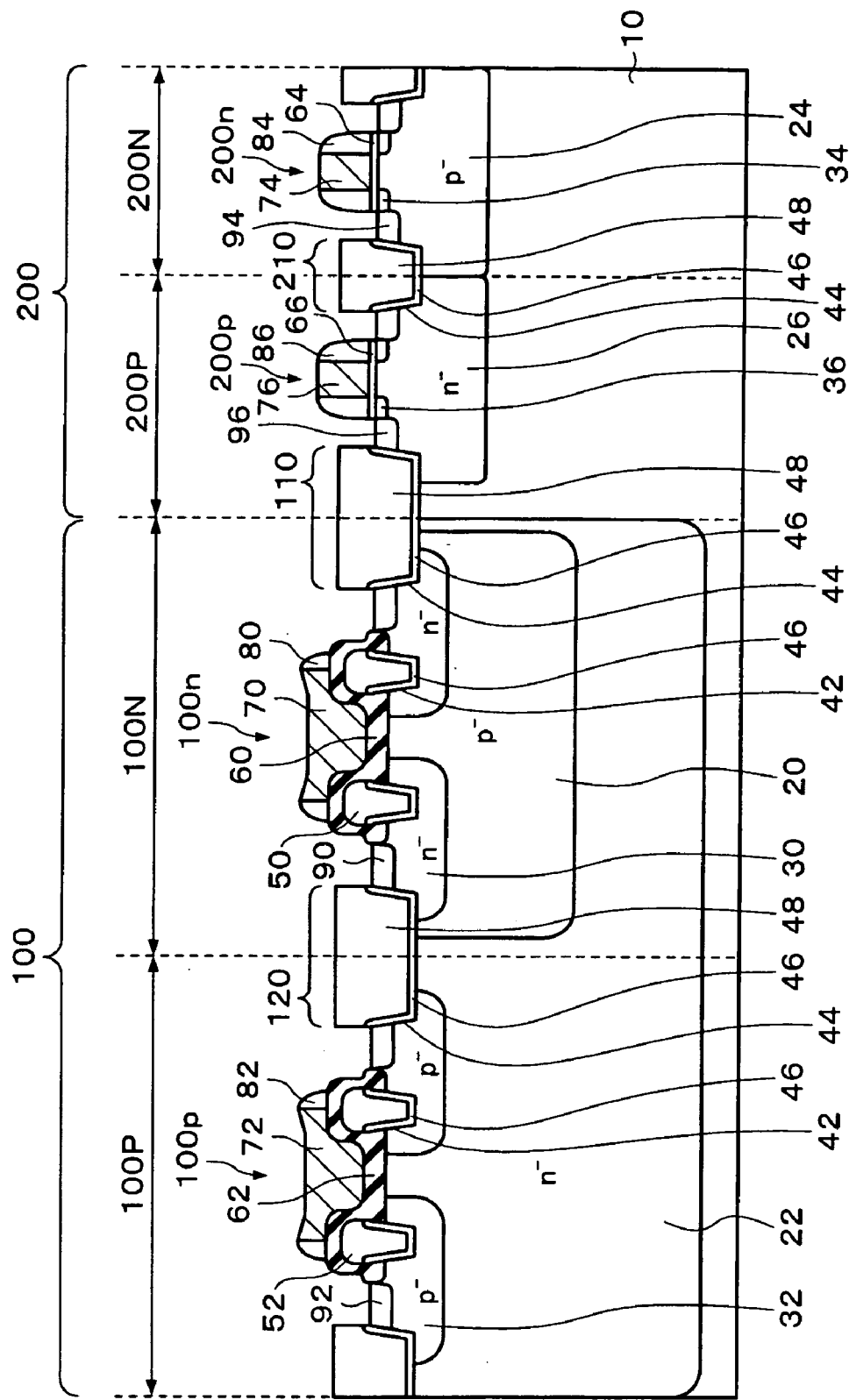
FIG. 1 is a cross-sectional view schematically showing a step in a method for manufacturing a semiconductor device in accordance with an embodiment of the present invention.

FIG. 1 is a cross-sectional view schematically showing a semiconductor device obtained by a manufacturing method in accordance with the embodiment of the present invention. The semiconductor device includes a semiconductor layer 10. The semiconductor device is provided with a high breakdown voltage transistor forming region 100 and a low voltage driving transistor forming region 200. The high breakdown voltage transistor forming region 100 includes an n-type high breakdown voltage transistor forming region 100N and a p-type high breakdown voltage transistor forming region 100P. The low voltage driving transistor forming region 200 includes an n-type low voltage driving transistor forming region 200N and a p-type low voltage driving transistor forming region 200P. An n-type high breakdown voltage transistor 100n is formed in the n-type high breakdown voltage transistor forming region 100N, and a p-type high breakdown voltage transistor 100p is formed in the p-type high breakdown voltage transistor forming region 100P. Similarly, an n-type low voltage driving transistor 200n is formed in the n-type low voltage driving transistor forming region 200N, and a p-type low voltage driving transistor 200p is formed in the p-type low voltage driving transistor forming region 200P.

In other words, on the same substrate (on the same chip), the n-type high breakdown voltage transistor 100n, the p-type high breakdown voltage transistor 100p, the n-type low voltage driving transistor 200n and the p-type low voltage driving transistor 200p are mixed and mounted. It is noted that FIG. 1 shows only four transistors for the sake of convenience, but it goes without saying that a plurality of each type of transistors may be formed on the same substrate.

High Breakdown Voltage Transistor Forming Region 100

First, the high breakdown voltage transistor forming region 100 will be described. A first element isolation region 110 is formed at a boundary between the high breakdown voltage transistor forming region 100 and the low voltage driving transistor forming region 200. In other words, the first element isolation region 110 isolates the high breakdown voltage transistor forming region 100 from the low voltage driving transistor forming region 200. As a result, the high breakdown voltage transistor forming region 100 is surrounded by the first element isolation region 110.

The n-type high breakdown voltage transistor 100n and the p-type high breakdown voltage transistor 100p are formed in the high breakdown voltage transistor forming region 100. A second element isolation region 120 is provided between the adjacent n-type high breakdown voltage transistor 100n and p-type high breakdown voltage transistor 100p.

Next, the structures of the n-type high breakdown voltage transistor 100n and the p-type high breakdown voltage transistor 100p will be described.

The n-type high breakdown voltage transistor 100n includes a first gate dielectric layer 60, offset trench dielectric layers 50, a gate electrode 70, n-type offset regions 30, sidewall dielectric layers 80, and n-type source/drain regions 90.

The first gate dielectric layer 60 is provided at least above a channel region in a p-type first well 20. The p-type first well 20 is formed in an n-type first well 22 at its upper section. The offset trench dielectric layers 50 are provided above the n-type offset regions 30 at both ends of the first gate dielectric layer 60. The gate electrode 70 is formed at least above the first gate dielectric layer 60. The n-type offset regions 30 are formed in the p-type first well 20 at its upper section. The sidewall dielectric layers 80 are formed on side surfaces of the gate electrode 70. The n-type source/drain regions 90 are provided in the semiconductor layer 10 outside the sidewall dielectric layers 80.

The n-type high breakdown voltage transistor 100p includes a first gate dielectric layer 62, offset trench dielectric layers 52, a gate electrode 72, p-type offset regions 32, sidewall dielectric layers 82, and p-type source/drain regions 92.

The first gate dielectric layer 62 is provided at least above a channel region in the n-type first well 22. The offset trench dielectric layers 52 are provided above the p-type offset regions 32 at both ends of the first gate dielectric layer 62. The gate electrode 72 is formed at least above the first gate dielectric layer 62. The p-type offset regions 32 are formed in the n-type first well 22 at its upper section. The sidewall dielectric layers 82 are formed on side surfaces of the gate electrode 72. The p-type source/drain regions 92 are provided in the semiconductor layer 10 outside the sidewall dielectric layers 82.

Low Voltage Driving Transistor Forming Region 200

Next, the low voltage driving transistor forming region 200 will be described. The low voltage driving transistor forming region 200 is provided with the n-type low voltage driving transistor 200n and the p-type low voltage driving transistor 200p. A third element isolation region 210 is provided between the adjacent n-type low voltage driving transistor 200n and p-type low voltage driving transistor 200p.

Next, the structure of each of the transistors will be described.

The n-type low voltage driving transistor 200n includes a second gate dielectric layer 64, a gate electrode 74, sidewall dielectric layers-84, n-type extension regions 34, and n-type source/drain regions 94.

The second gate dielectric layer 64 is provided at least above a channel region in a p-type second well 24. The gate electrode 74 is formed above the second gate dielectric layer 64. The sidewall dielectric layers 84 are formed on side surfaces of the gate electrode 74. The n-type extension regions 34 are formed in the p-type second well 24 at its upper section. The n-type source/drain regions 94 are provided in the semiconductor layer 10 outside the sidewall dielectric layers 84.

The p-type low voltage driving transistor 200p includes a second gate dielectric layer 66, a gate electrode 76, sidewall dielectric layers 86, p-type extension regions 36, and p-type source/drain regions 96.

The second gate dielectric layer 66 is provided at least above a channel region in an n-type second well 26. The gate electrode 76 is formed above the second gate dielectric layer 66. The sidewall dielectric layers 86 are formed on side surfaces of the gate electrode 76. The p-type extension regions 36 are formed in the n-type second well 26 at its upper section. The p-type source/drain regions 96 are formed in the semiconductor layer 10 outside the sidewall dielectric layers 86.

Method for Manufacturing a Semiconductor Device

Next, a method for manufacturing a semiconductor device in accordance with an embodiment of the present invention will be described with reference to FIGS. 1–20. FIGS. 1–20 are cross-sectional views schematically showing steps in the method for manufacturing a semiconductor device in accordance with the embodiment of the present invention.

Figure 2:
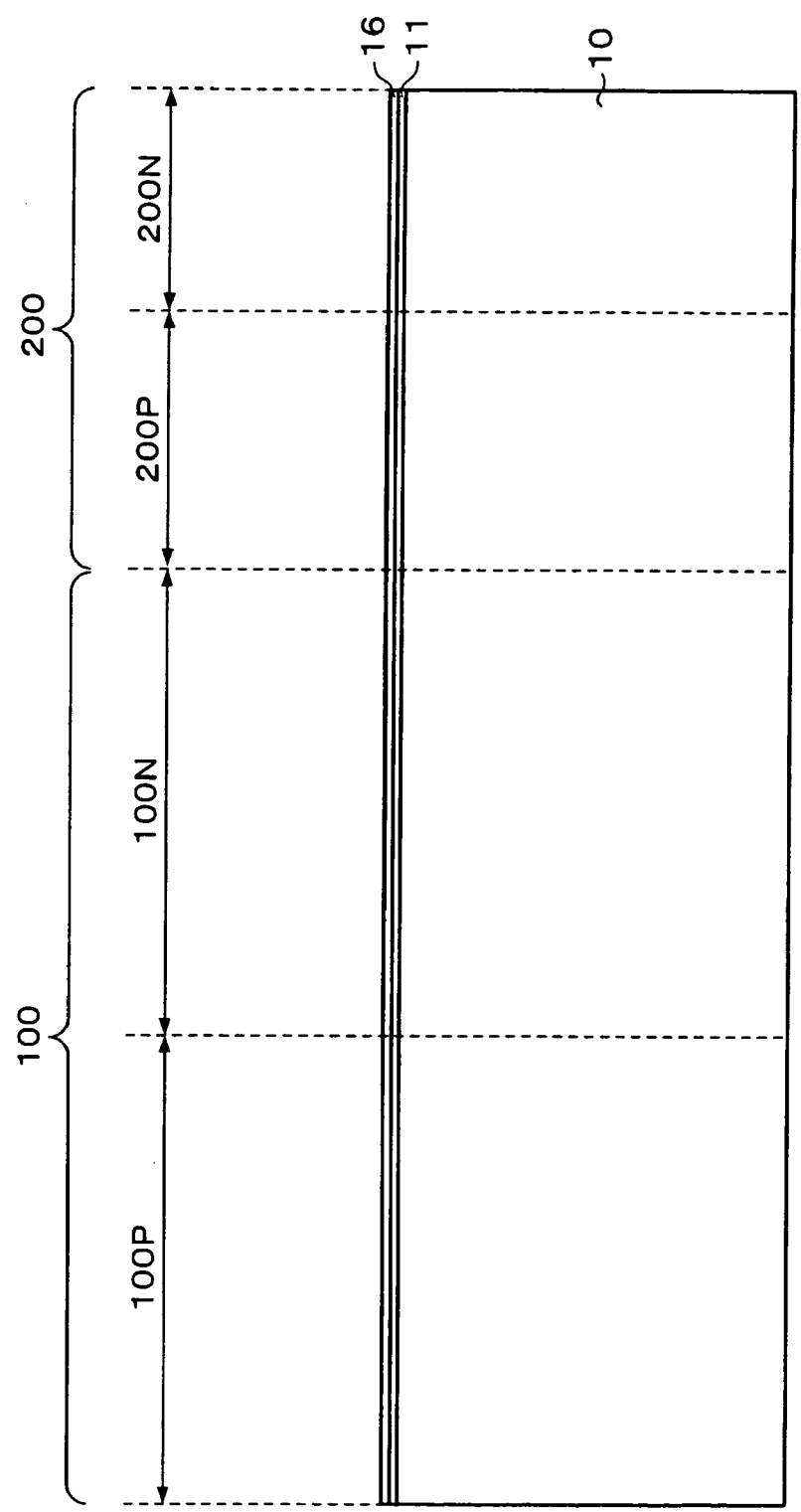
FIG. 2 is a cross-sectional view schematically showing a step in the method for manufacturing a semiconductor device in accordance with the embodiment of the present invention.

(a) First, as shown in FIG. 2, a first pad layer 11 is formed on a semiconductor layer 10. Next, a mask layer 16 is formed on the first pad layer 11. The semiconductor layer 10 includes at least silicon, and is composed of silicon, silicon-germanium, or the like. The semiconductor layer 10 can be a silicon substrate in a bulk form, or a silicon layer in a SOI (Silicon On Insulator) substrate. As the first pad layer 11, silicon oxide, silicon oxynitride, or the like can be used. The first pad layer 11 can be formed by, for example, a thermal oxidation method. Silicon nitride or the like can be used as the mask layer 16. The mask layer 16 can be formed by, for example, a CVD method.

Figure 3:
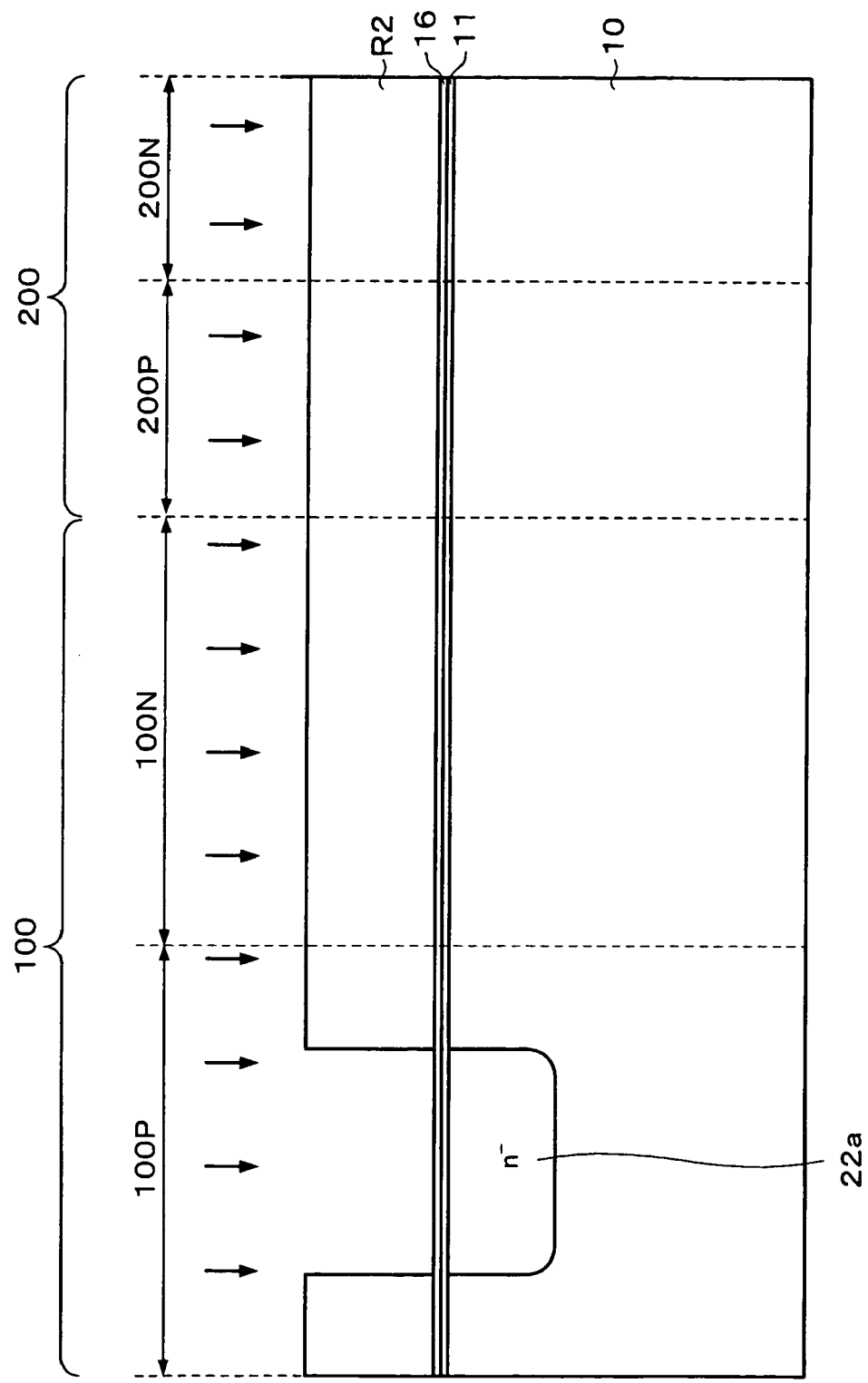
FIG. 3 is a cross-sectional view schematically showing a step in the method for manufacturing a semiconductor device in accordance with the embodiment of the present invention.

(b) Next, as shown in FIG. 3, a first impurity layer 22a that becomes an n-type first well is formed in the p-type high breakdown voltage transistor forming region 100P. More specifically, a resist layer R1 having a predetermined pattern is formed by a lithography technique. By using the resist layer R1 as a mask, n-type impurity ions such as phosphorous, arsenic or the like are introduced in the semiconductor layer 10, to thereby form the first impurity layer 22a. The position where the first impurity layer 22a is to be formed can be decided by, for example, aligning mask patterns by using alignment marks (not shown) formed on the semiconductor layer 10. Alignment in steps to be described below is similarly conducted. Then, the resist layer R1 is removed by ashing. Next, the semiconductor layer 10 is heat treated, to thereby thermally diffuse the impurity of the first impurity layer 22a.

Figure 4:
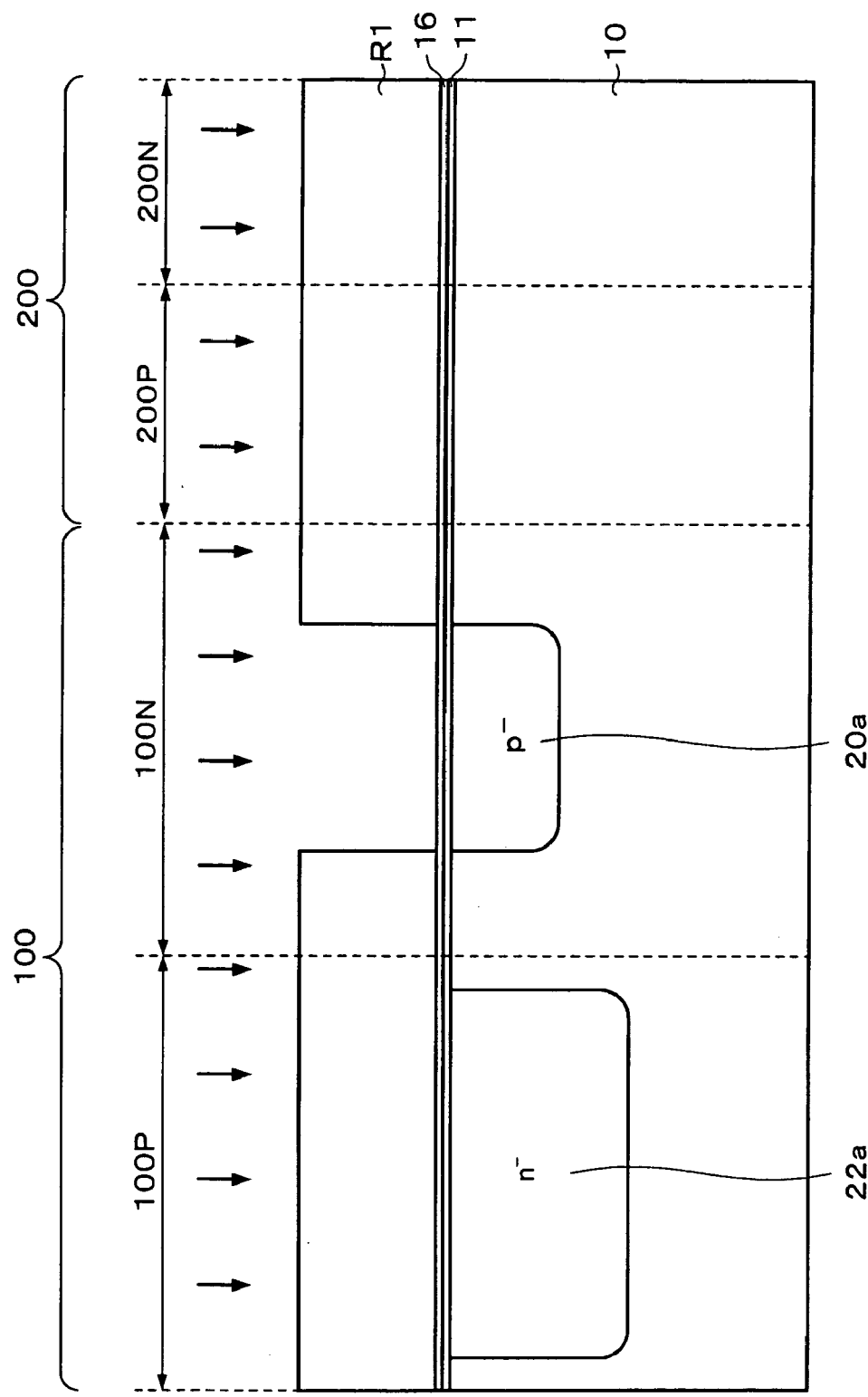
FIG. 4 is a cross-sectional view schematically showing a step in the method for manufacturing a semiconductor device in accordance with the embodiment of the present invention.

(c) Next, as shown in FIG. 4, a first impurity layer 20a that becomes a p-type first well is formed in the n-type high breakdown voltage transistor forming region 100N. More specifically, a resist layer R2 having a predetermined pattern is formed by a lithography technique. By using the resist layer R2 as a mask, a p-type impurity such as boron or the like is introduced in the semiconductor layer 10 one time or plural times, to thereby form the first impurity layer 20a in the semiconductor layer 10, and then the resist layer R2 is removed by ashing.

Next, the semiconductor layer 10 is heat treated, to thereby thermally diffuse the impurity of the p-type first impurity layer 20a and the impurity of the n-type first impurity layer 22a formed in step (b).

Figure 5:
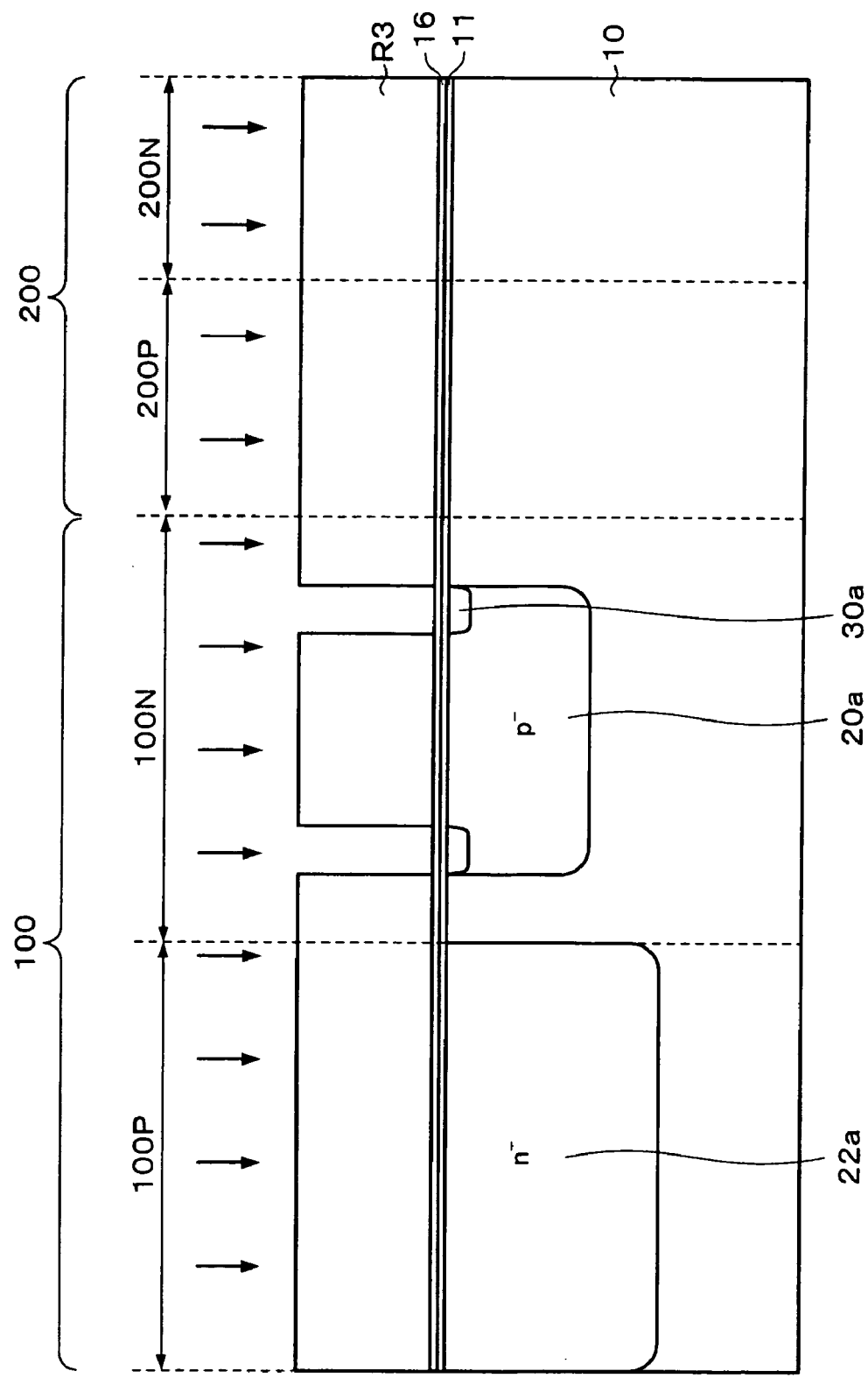
FIG. 5 is a cross-sectional view schematically showing a step in the method for manufacturing a semiconductor device in accordance with the embodiment of the present invention.

(d) Next, as shown in FIG. 5, second impurity layers 30a that become n-type offset regions in an n-type high breakdown voltage transistor are formed in the n-type high breakdown voltage transistor forming region 100N. More specifically, first, a resist layer R3 that covers predetermined regions is formed. By using the resist layer R3 as a mask, an n-type impurity is introduced in the semiconductor layer 10, to thereby form the second impurity layers 30a. Then, the resist layer R3 is removed by ashing.

Figure 6:
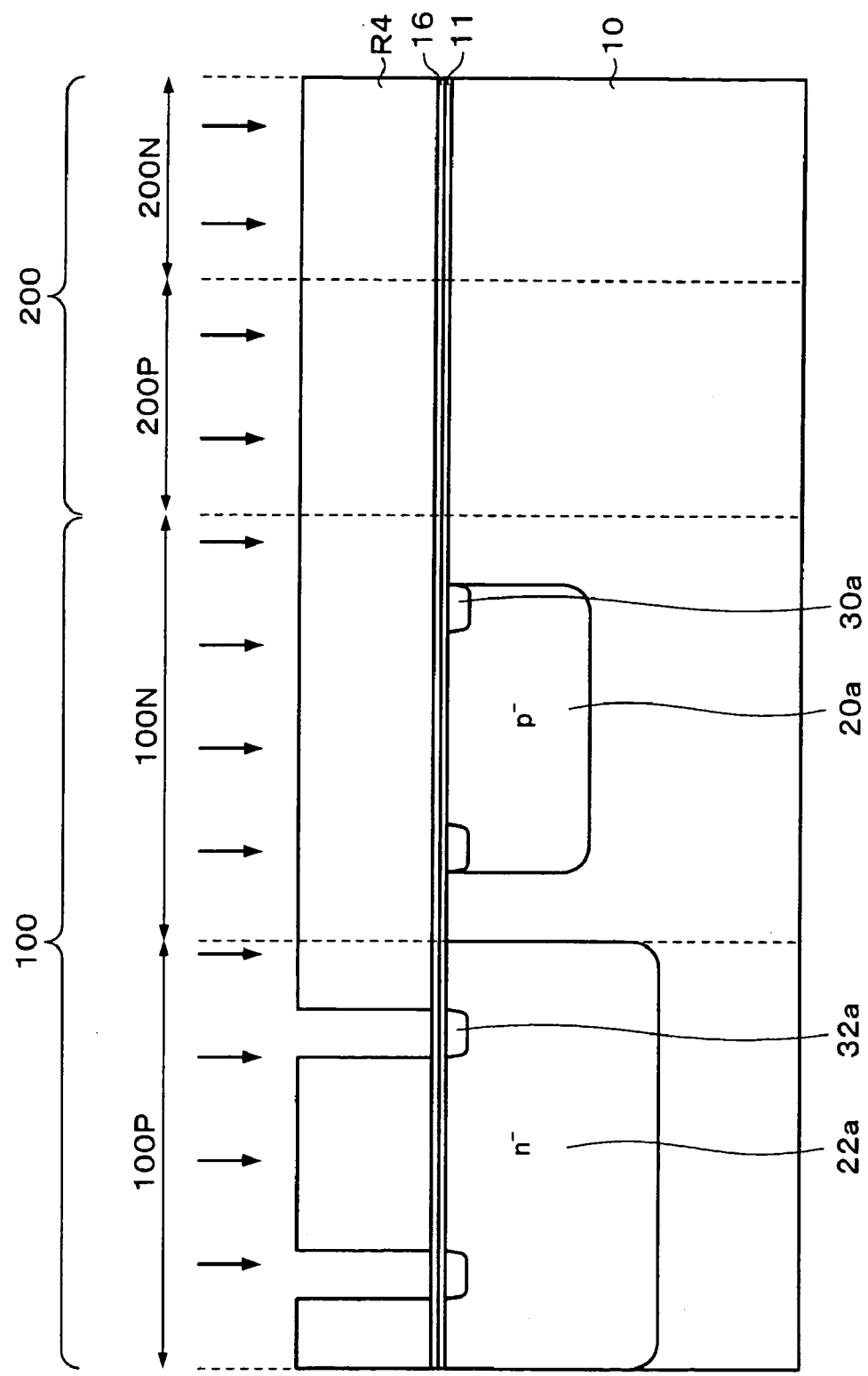
FIG. 6 is a cross-sectional view schematically showing a step in the method for manufacturing a semiconductor device in accordance with the embodiment of the present invention.

(e) Next, as shown in FIG. 6, second impurity layers 32a that become p-type offset regions in a p-type high breakdown voltage transistor are formed in the p-type high breakdown voltage transistor forming region 100P. More specifically, first, a resist layer R4 that covers predetermined regions is formed. By using the resist layer R4 as a mask, a p-type impurity is introduced in the semiconductor layer 10 to thereby form the second impurity layer 32a therein. Then, the resist layer R4 is removed by ashing. Steps (d) and (e) can be done in the reverse order of the present embodiment.

Figure 7:
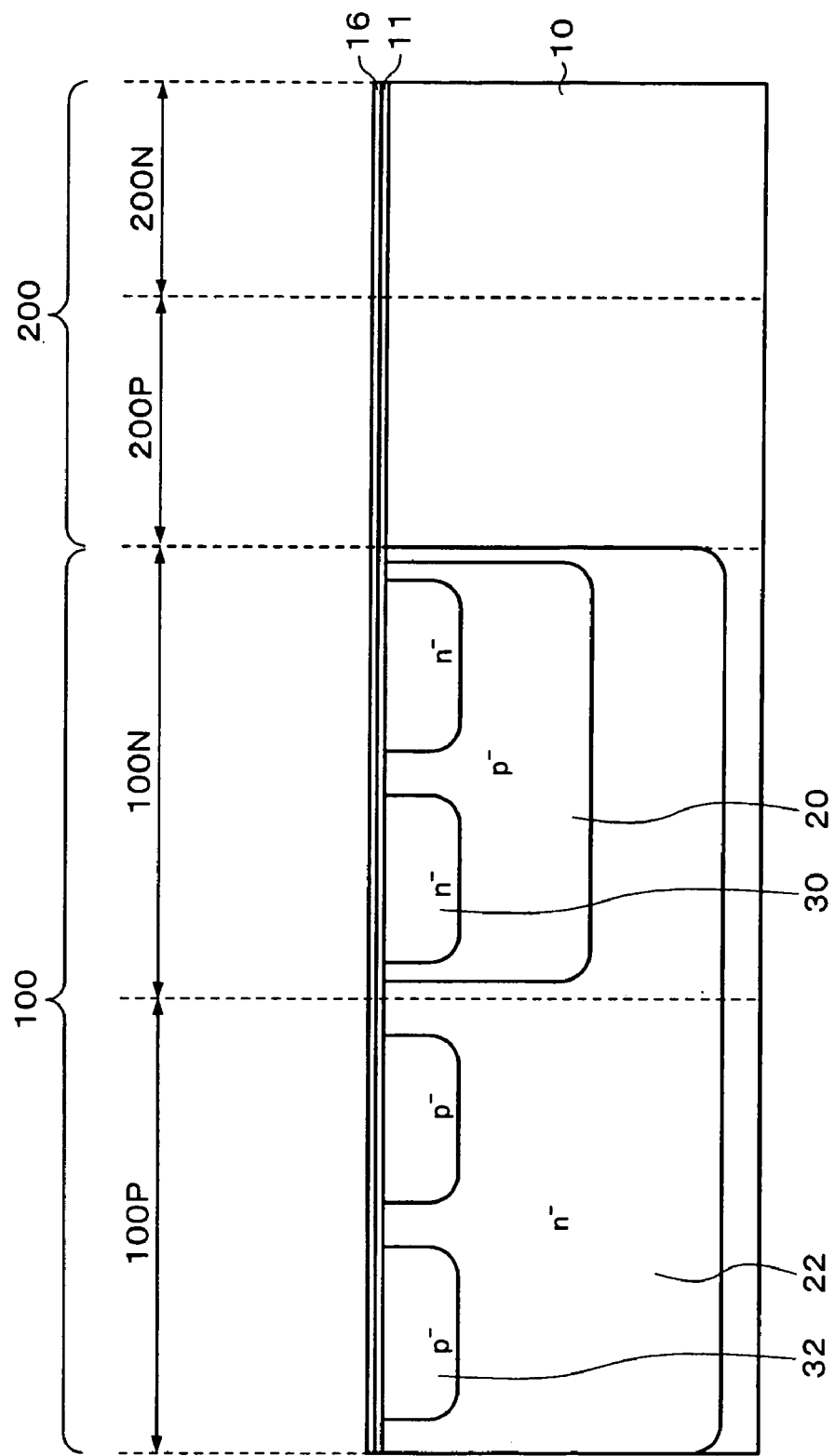
FIG. 7 is a cross-sectional view schematically showing a step in the method for manufacturing a semiconductor device in accordance with the embodiment of the present invention.

(f) Next, as shown in FIG. 7, the semiconductor layer 10 is heat treated, thereby forming the p-type first well 20, the n-type first well 22, the n-type offset regions 30 of an n-type high breakdown voltage transistor, and the p-type offset regions 32 of a p-type high breakdown voltage transistor. In other words, the impurity of the first impurity layers 20a is diffused such that the p-type first well 20 is formed. The impurity of the first impurity layers 22a is diffused such that the n-type first well 22 is formed. The impurity of the second impurity layers 30a is diffused such that the n-type offset regions 30 of the n-type high breakdown voltage transistor are formed. The impurity of the second impurity layers 32a is diffused such that the p-type offset regions 32 of the p-type high breakdown voltage transistor are formed. The temperature of the heat treatment may be, for example, 1100–1200° C.

Next, the mask layer 16 and the first pad layer 11 are removed. The removal of the mask layer 16 may be conducted, for example, by wet etching with heated phosphoric acid. The removal of the first pad layer 11 may be conducted, for example, by wet etching with hydrofluoric acid.

Figure 8:
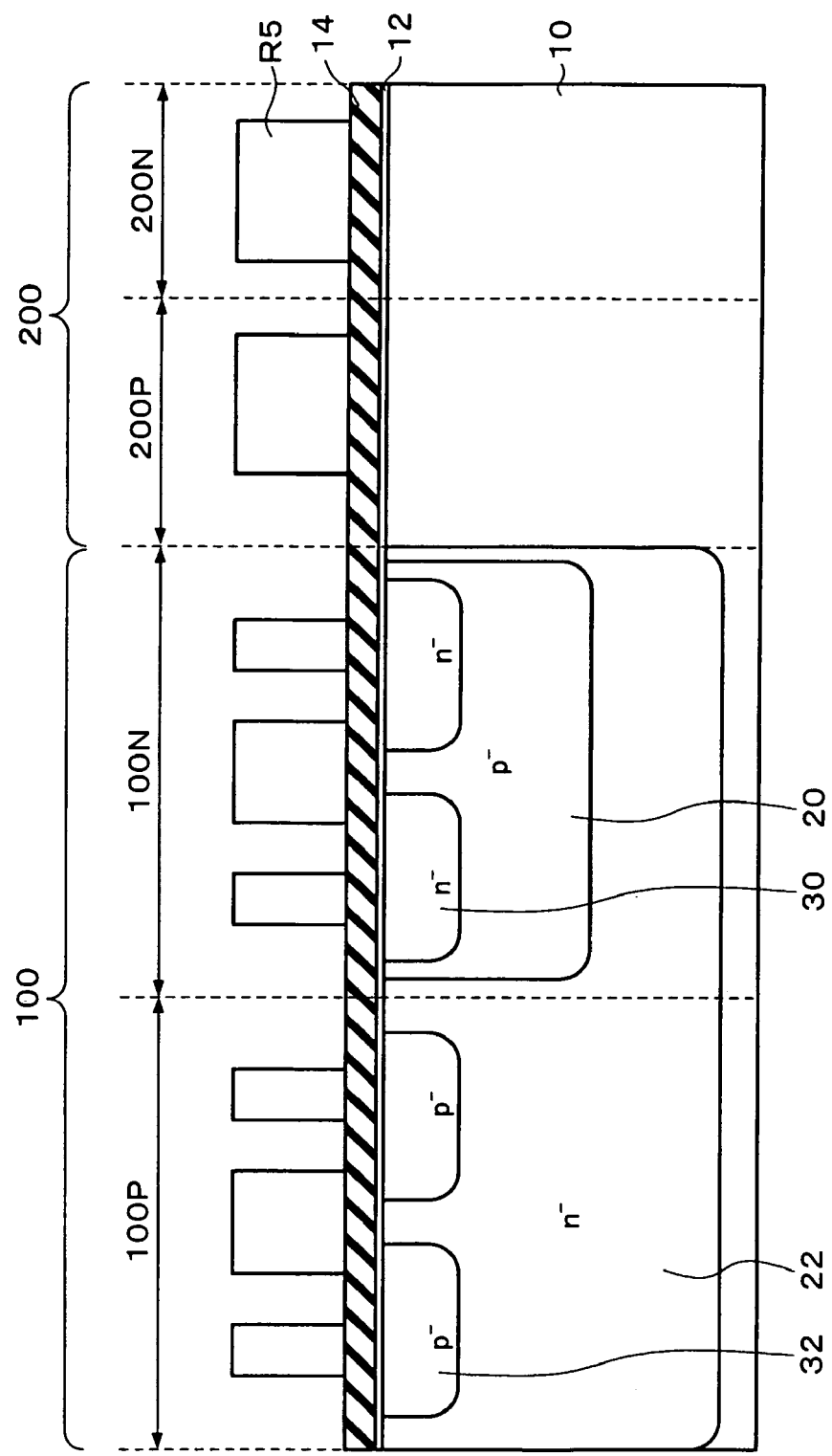
FIG. 8 is a cross-sectional view schematically showing a step in the method for manufacturing a semiconductor device in accordance with the embodiment of the present invention.

(g) Next, as shown in FIG. 8, a second pad layer 12 is formed on the semiconductor layer 10. As the second pad layer 12, silicon oxide, silicon oxinitride or the like can be used. The second pad layer 12 can be formed by, for example, a thermal oxidation method. The film thickness of the second pad layer 12 may be the same as or different from the film thickness of the first pad layer 11. The material of the second pad layer 12 may be the same as or different from the material of the first pad layer 11.

Next, a stopper layer 14 is formed on the second pad layer 12. The stopper layer 14 can be formed by, for example, a CVD method. For example, silicon nitride can be used for the stopper layer 14.

Then, a resist layer R5 having a predetermined pattern is formed on the stopper layer 14. The resist layer R5 is formed with opening sections above regions, in the high breakdown voltage transistor forming region 100, where the first element isolation region 110, the second element isolation region 120 and the offset trench dielectric layers 50 and 52 are formed, and with opening sections above regions, in the low voltage driving transistor forming region 200, where the first element isolation region 110 and the third element isolation region 210 are formed.

Figure 9:
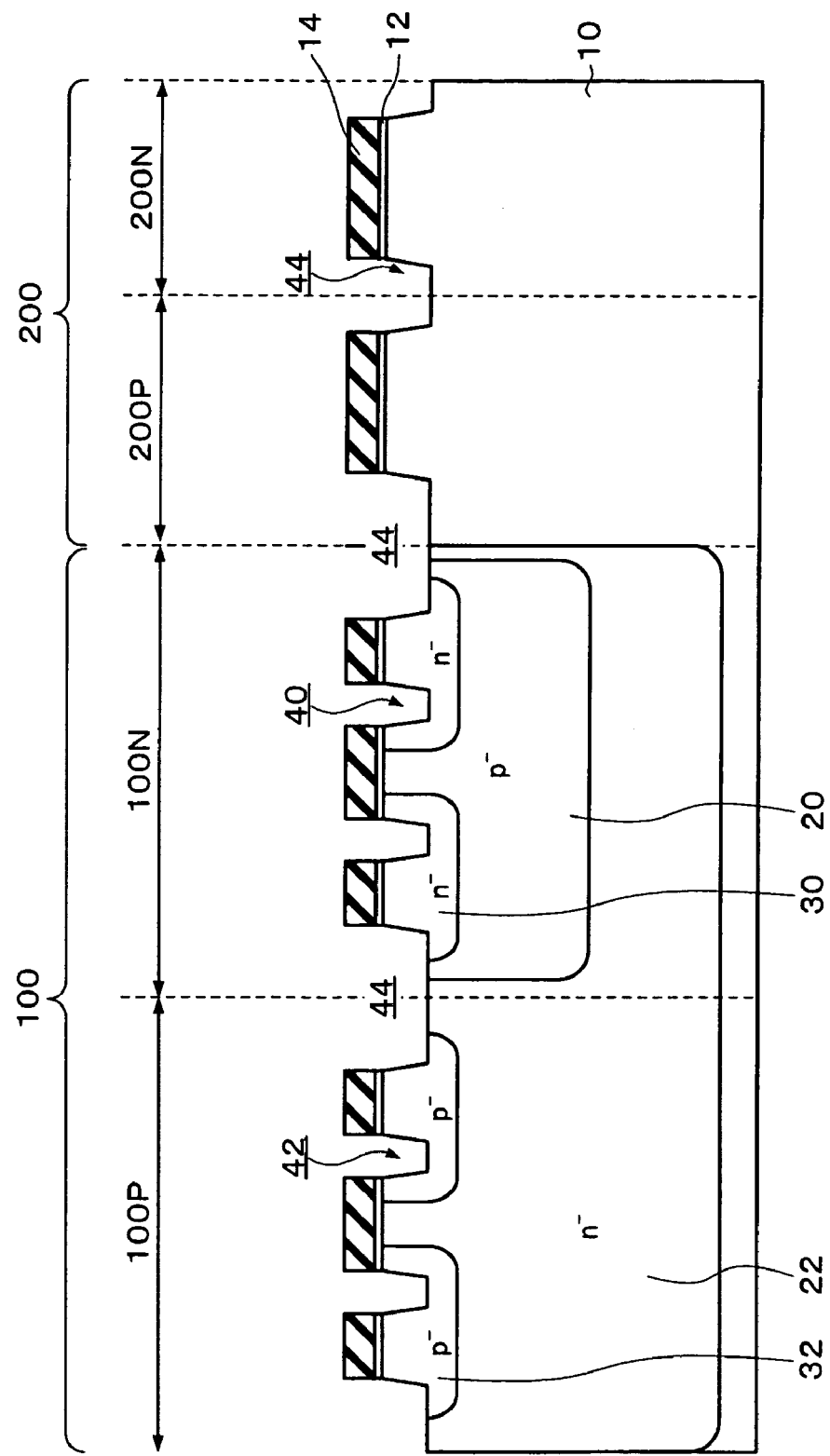
FIG. 9 is a cross-sectional view schematically showing a step in the method for manufacturing a semiconductor device in accordance with the embodiment of the present invention.

(h) Next, as shown in FIG. 9, by using resist layer R5 (see FIG. 8) as a mask, the stopper layer 14 and the second pad layer 12 are etched. Then, after removing the resist layer R5 by ashing, the semiconductor layer 10 is etched by using the stopper layer 14 and the second pad layer 12 as a mask, thereby forming offset trenches 40 and 42, and trenches 44. The semiconductor layer 10 may be etched by, for example, dry etching. Then, the resist layer R5 is removed by ashing.

Figure 10:
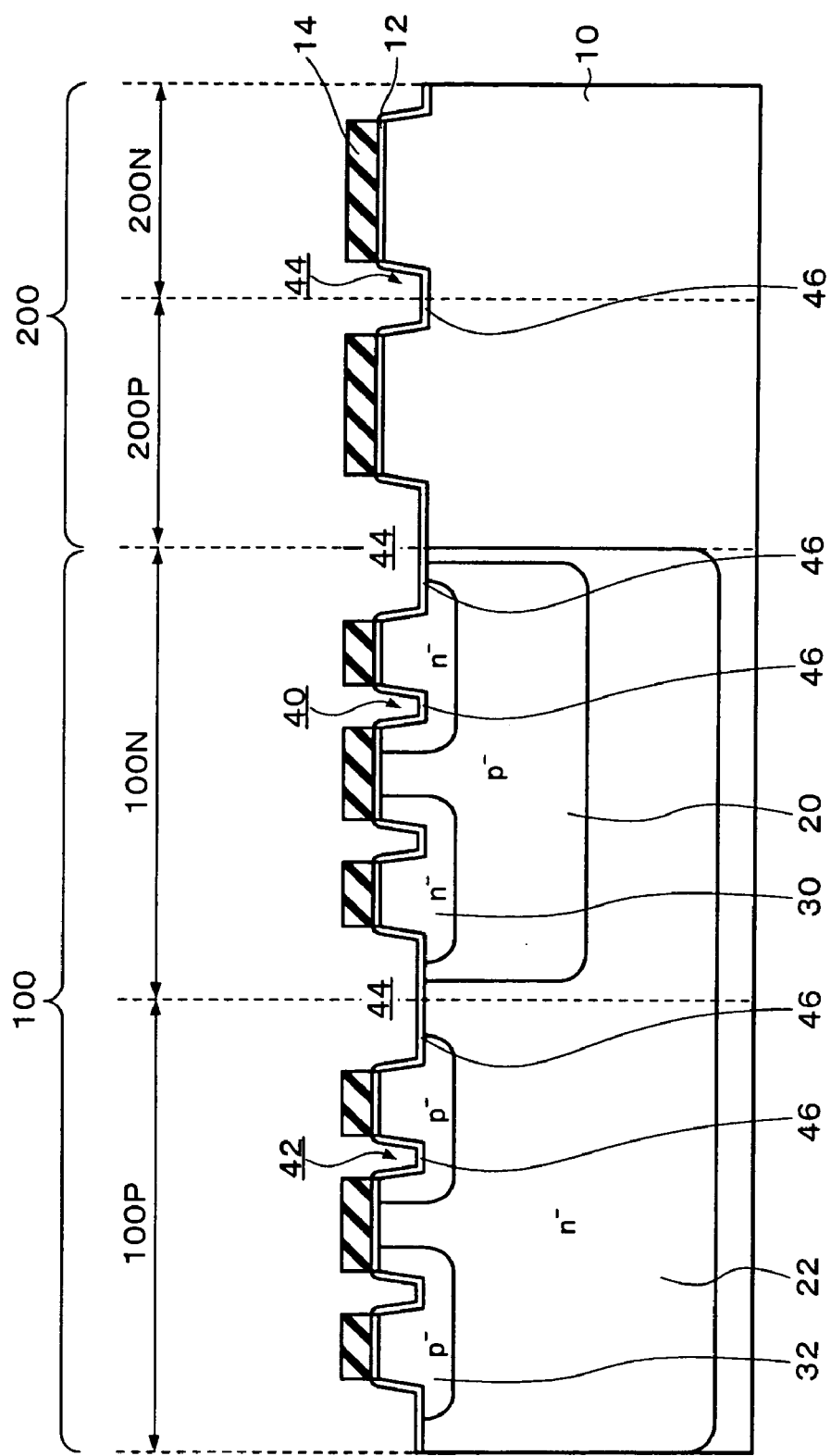
FIG. 10 is a cross-sectional view schematically showing a step in the method for manufacturing a semiconductor device in accordance with the embodiment of the present invention.

(i) Next, as shown in FIG. 10, a trench oxide layer 46 is formed on surfaces of the offset trenches 40 and 42 and the trenches 44. The trench oxide layer 46 may be formed by, for example, a thermal oxidation method. The film thickness of the trench oxide layer 46 is, for example, 30–50 nm.

Also, before forming the trench oxide layer 46, end sections of the second pad layer 12 can be etched depending on the requirements. By implementing such a configuration, the semiconductor layer 10 and the trench oxide layer 46 at upper end sections of the offset trenches 40 and 42 and the trenches 44 are formed to have rounded configurations when forming the trench oxide layer 46. Because the semiconductor layer 10 has rounded configurations at the upper end sections of the offset trenches 40 and 42 and the trenches 44, influences such as lowering of the gate breakdown voltage and/or formation of parasitic transistor elements, which may be caused by thinning of the gate dielectric films at the upper end sections of the offset trenches 40 and 42 and the trenches 44 at later steps can be substantially avoided. Also, because the trench oxide layer 46 is formed with rounded configurations, stepped differences therein become rounded, and offset trench dielectric layers 50 and 52 and trench dielectric layers 48 to be formed in later steps can be well embedded.

Figure 11:
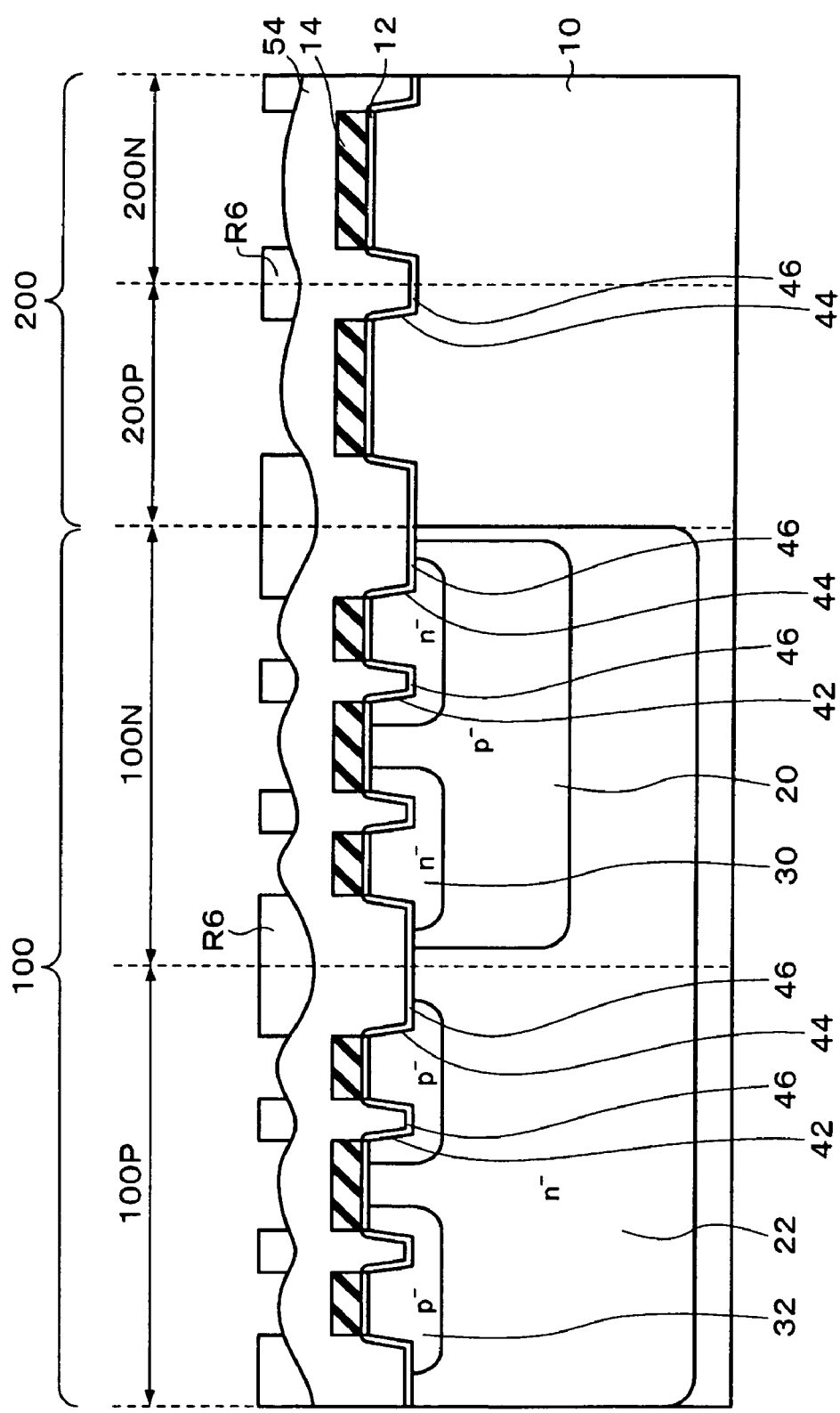
FIG. 11 is a cross-sectional view schematically showing a step in the method for manufacturing a semiconductor device in accordance with the embodiment of the present invention.

(j) Next, as shown in FIG. 11, a dielectric layer 54 is formed in a manner to embed the offset trenches 40 and 42 and the trenches 44. The dielectric layer 54 is formed to embed at least the offset trenches 40 and 42 and the trenches 44, and further to cover the stopper layer 14.

Then, unevenness of the dielectric layer 54 is subject to a planarizing processing. More particularly, the planarizing processing is conducted as follows. First, a resist layer R6 is formed on the dielectric layer 54 with openings provided only at regions where the dielectric layer 54 has convex configurations. Then, the regions where the dielectric layer 54 has convex configurations are removed by etching. Then, the resist layer R6 is removed by ashing. By this planarizing processing, the dielectric layer 54 can be planarized well in the following step (k).

Figure 12:
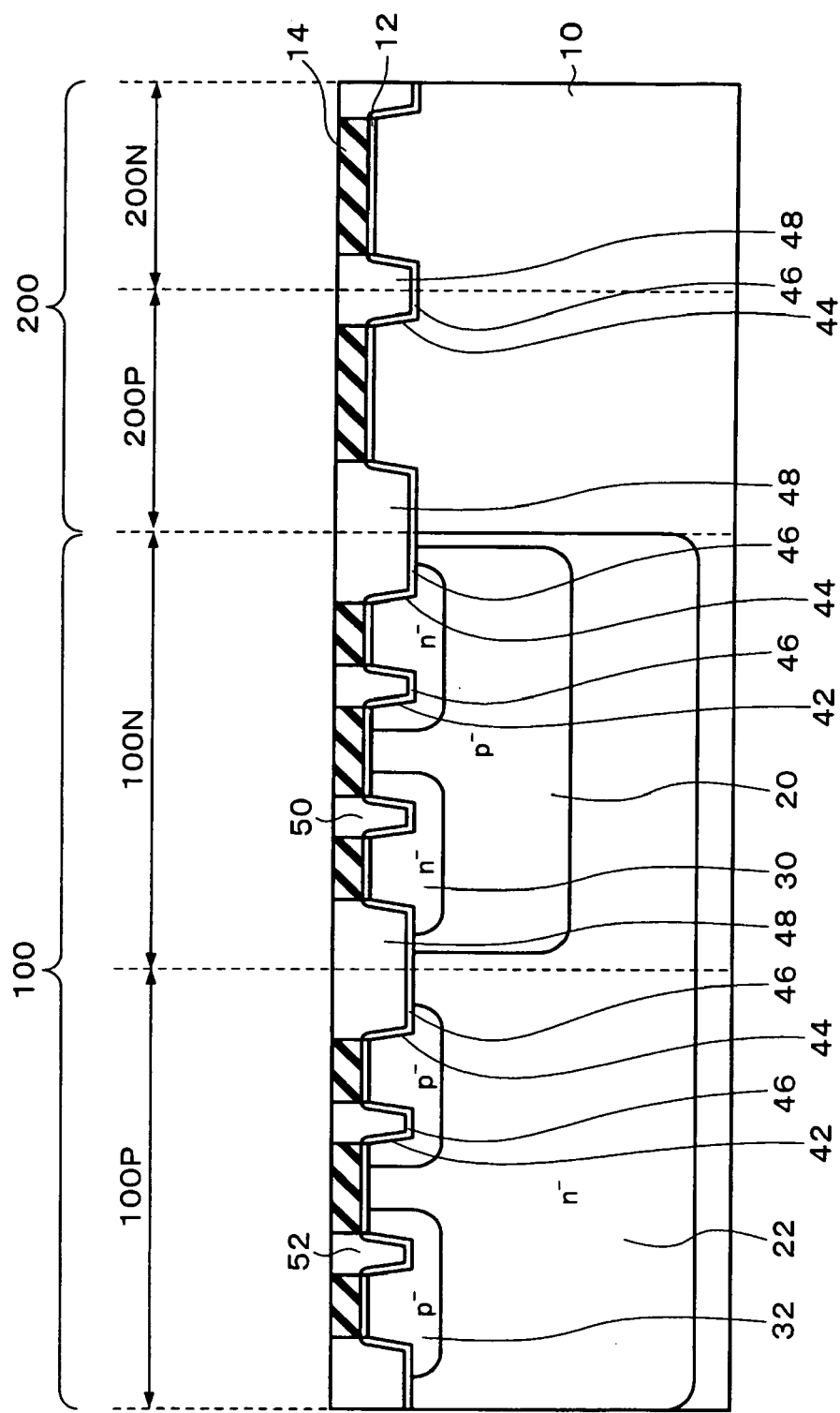
FIG. 12 is a cross-sectional view schematically showing a step in the method for manufacturing a semiconductor device in accordance with the embodiment of the present invention.

(k) Next, as shown in FIG. 12, the dielectric layer 54 is removed until the upper surface of the stopper layer 14 is exposed. The removal of the dielectric layer 54 can be conducted by, for example, a CMP method. In this way, offset trench dielectric layers 50 and 52 are formed at the offset trenches 40 and 42 in the high breakdown voltage transistor forming region 100. Trench dielectric layers 48 are formed at the trenches 44. As a result, the first element isolation region 110, the second element isolation region 120 and the third element isolation region 210 are formed.

Figure 13:
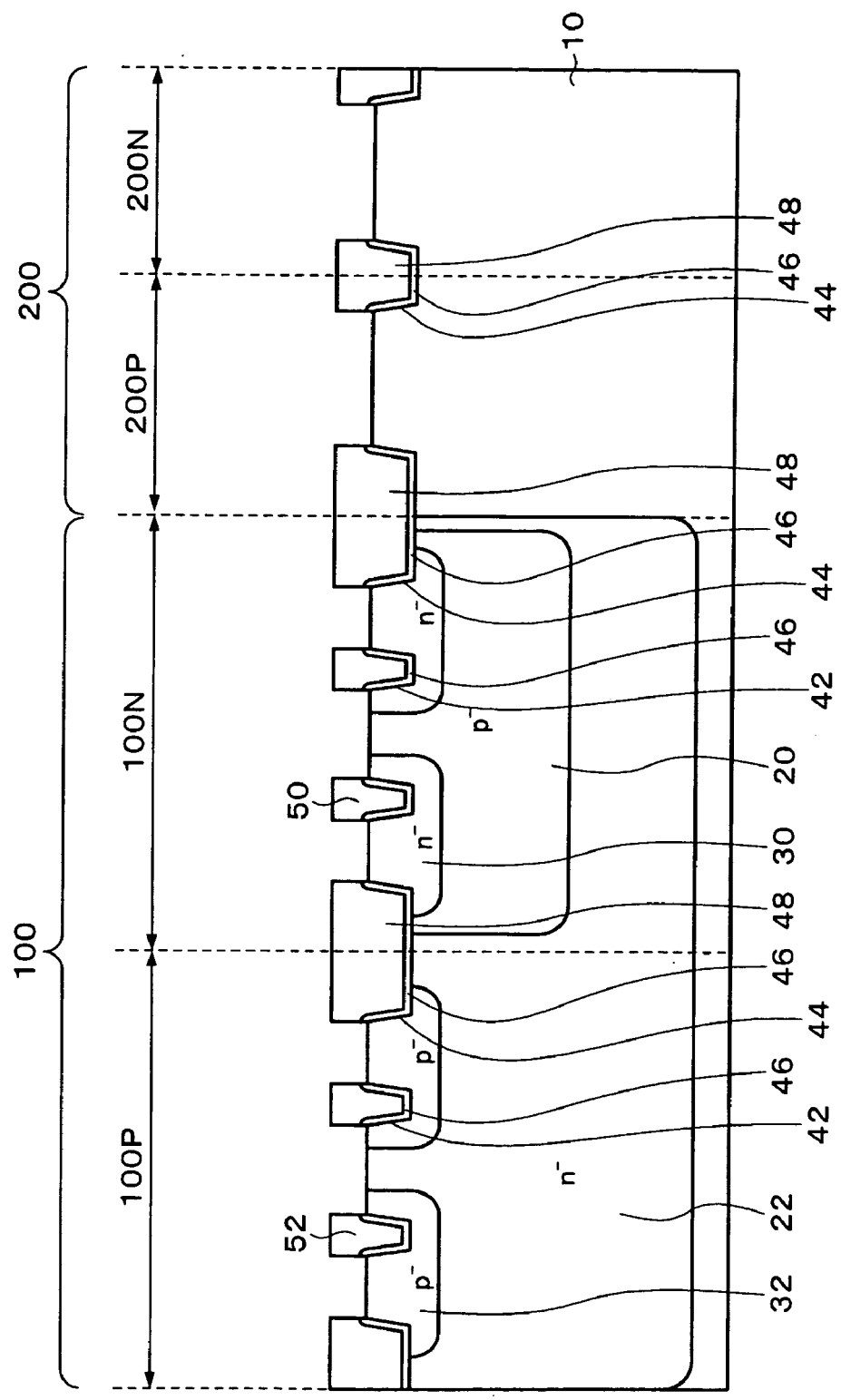
FIG. 13 is a cross-sectional view schematically showing a step in the method for manufacturing a semiconductor device in accordance with the embodiment of the present invention.
Figure 14:
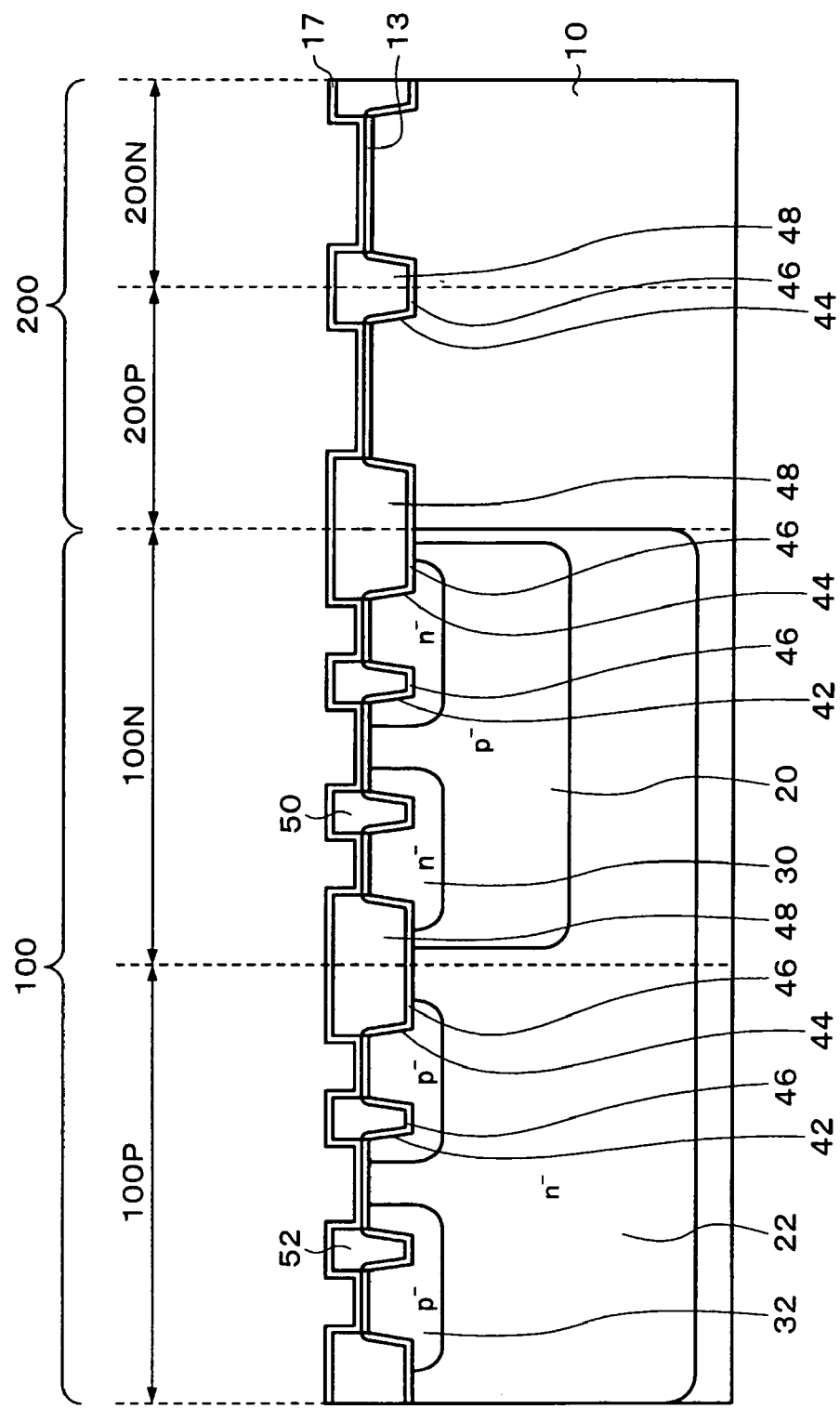
FIG. 14 is a cross-sectional view schematically showing a step in the method for manufacturing a semiconductor device in accordance with the embodiment of the present invention.

(l) Next, as shown in FIG. 13, the stopper layer 14 and the second pad layer 12 are removed. The removal of the stopper layer 14 may be conducted by, for example, wet etching with heated phosphoric acid. The removal of the second pad layer 12 may be conducted, for example, by wet etching with hydrofluoric acid (m) Next, as shown in FIG. 14, a third pad layer 13 is formed over the entire surface of the high breakdown voltage transistor forming region 100 and the low voltage driving transistor forming region 200. Next, a mask layer 17 is formed on the third pad layer 13. As the mask layer 17, for example, silicon nitride can be used. The mask layer 17 can be formed by, for example, a CVD method.

Figure 15:
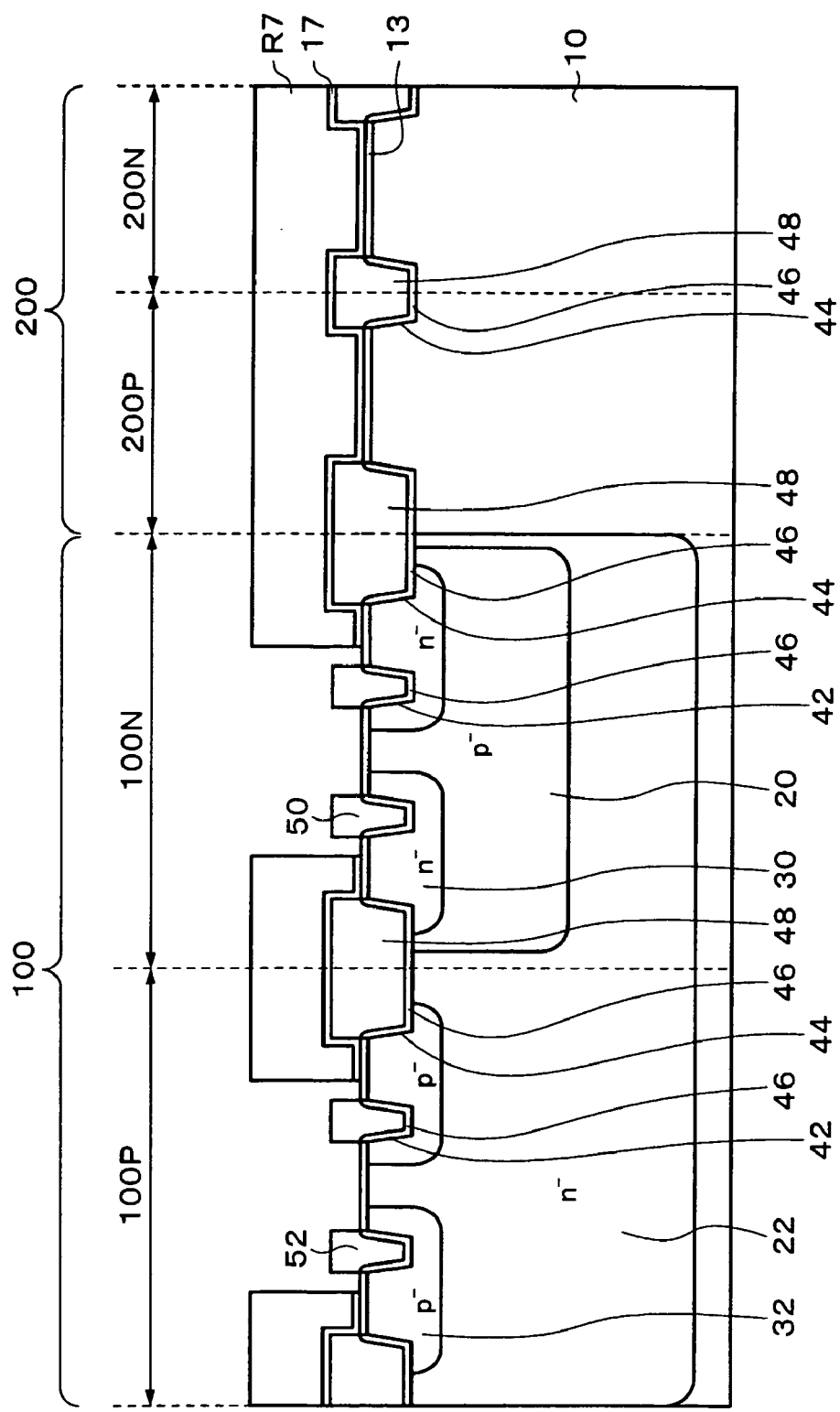
FIG. 15 is a cross-sectional view schematically showing a step in the method for manufacturing a semiconductor device in accordance with the embodiment of the present invention.

(n) Next, as shown in FIG. 15, a resist layer R7 is formed in a manner to cover areas excluding the regions where a first gate dielectric layer of the n-type high breakdown voltage transistor and a first gate dielectric layer of the p-type high breakdown voltage transistor are to be formed in the high breakdown voltage transistor forming region 100. By using the resist layer R7 as a mask, exposed portions of the mask layer 17 are removed. Then, channel doping is conducted depending on the requirements in the high breakdown voltage transistor forming region 100. For instance, the channel doping can be conducted by the following method.

First, a resist layer (not shown) is formed in a manner to cover areas excluding the n-type high breakdown voltage transistor forming region 100N. By using the resist layer as a mask, for example, an n-type impurity such as phosphorus is injected. Then, the resist layer is removed by ashing. Then, a resist layer (not shown) is formed to cover areas excluding the p-type high breakdown voltage transistor forming region 100P. By using the resist layer as a mask, for example, a p-type impurity such as boron is injected. Then, the resist layer is removed by ashing.

Figure 16:
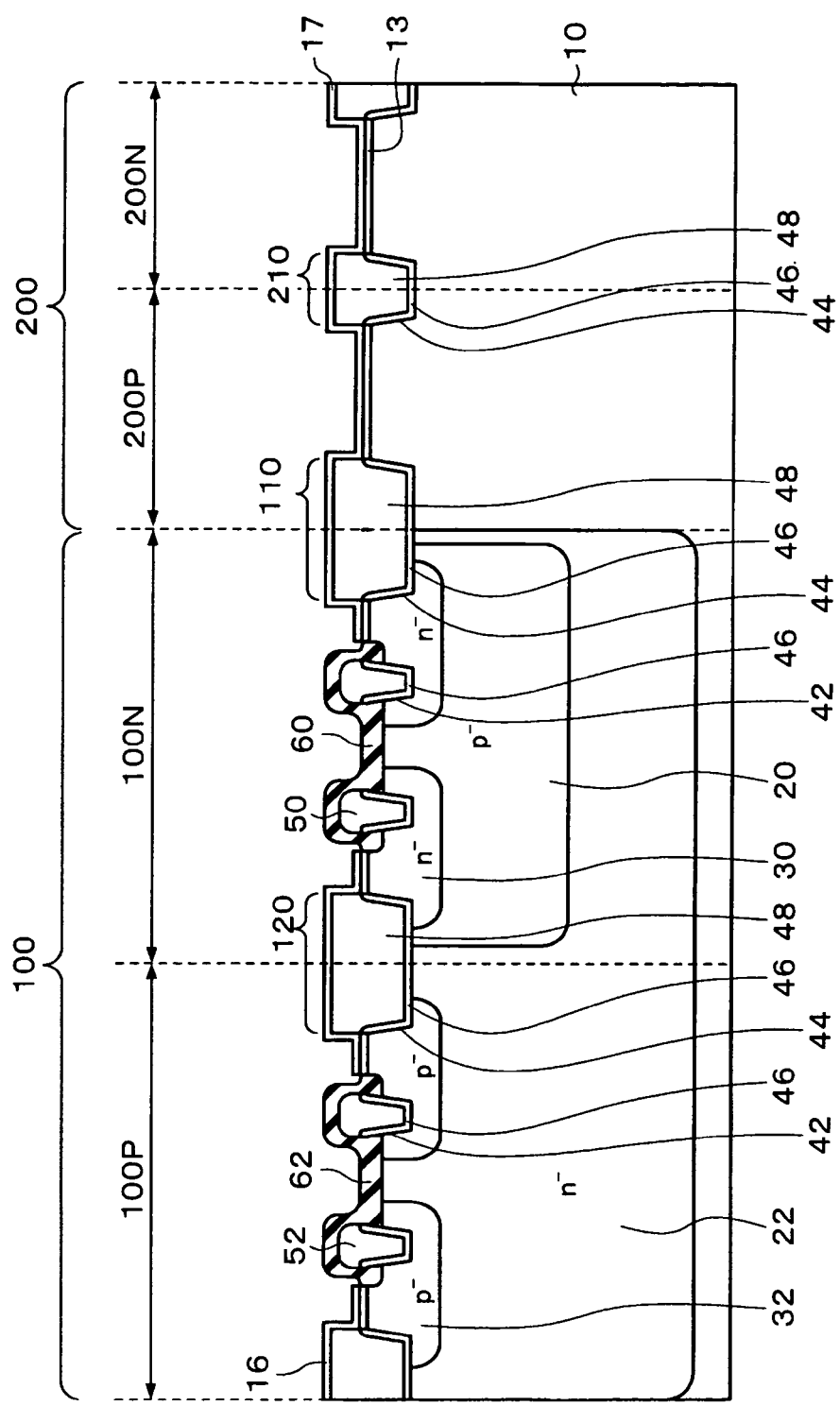
FIG. 16 is a cross-sectional view schematically showing a step in the method for manufacturing a semiconductor device in accordance with the embodiment of the present invention.

(o) Next, as shown in FIG. 16, first gate dielectric layers 60 and 62 are formed in the high breakdown voltage transistor forming region 100. The first gate dielectric layers 60 and 62 can be formed by a selective thermal oxidation method. The film thickness of the first gate dielectric layer 60 and 62 is, for example, 70–160 nm. Then, remaining portions of the mask layer 17 are removed.

Figure 17:
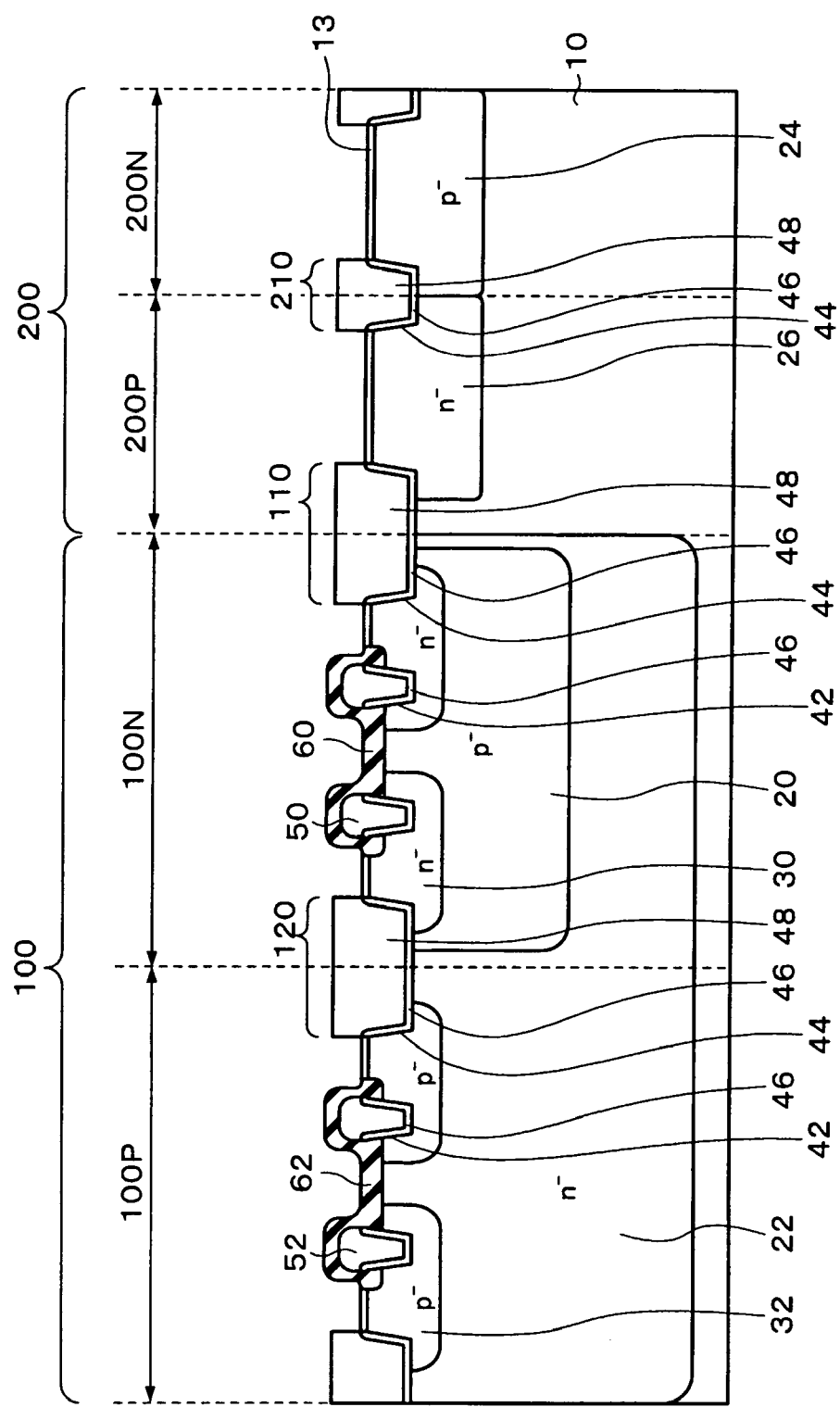
FIG. 17 is a cross-sectional view schematically showing a step in the method for manufacturing a semiconductor device in accordance with the embodiment of the present invention.

(p) Next, as shown in FIG. 17, a p-type second well 24 and an n-type second well 26 are formed in the low voltage driving transistor forming region 200. The p-type second well 24 and the n-type second well 26 are formed by forming a mask layer (not shown) having a predetermined pattern by using an ordinary lithography technique, and introducing an impurity of a predetermined conduction type. Then, channel doping can be conducted if necessary.

Figure 18:
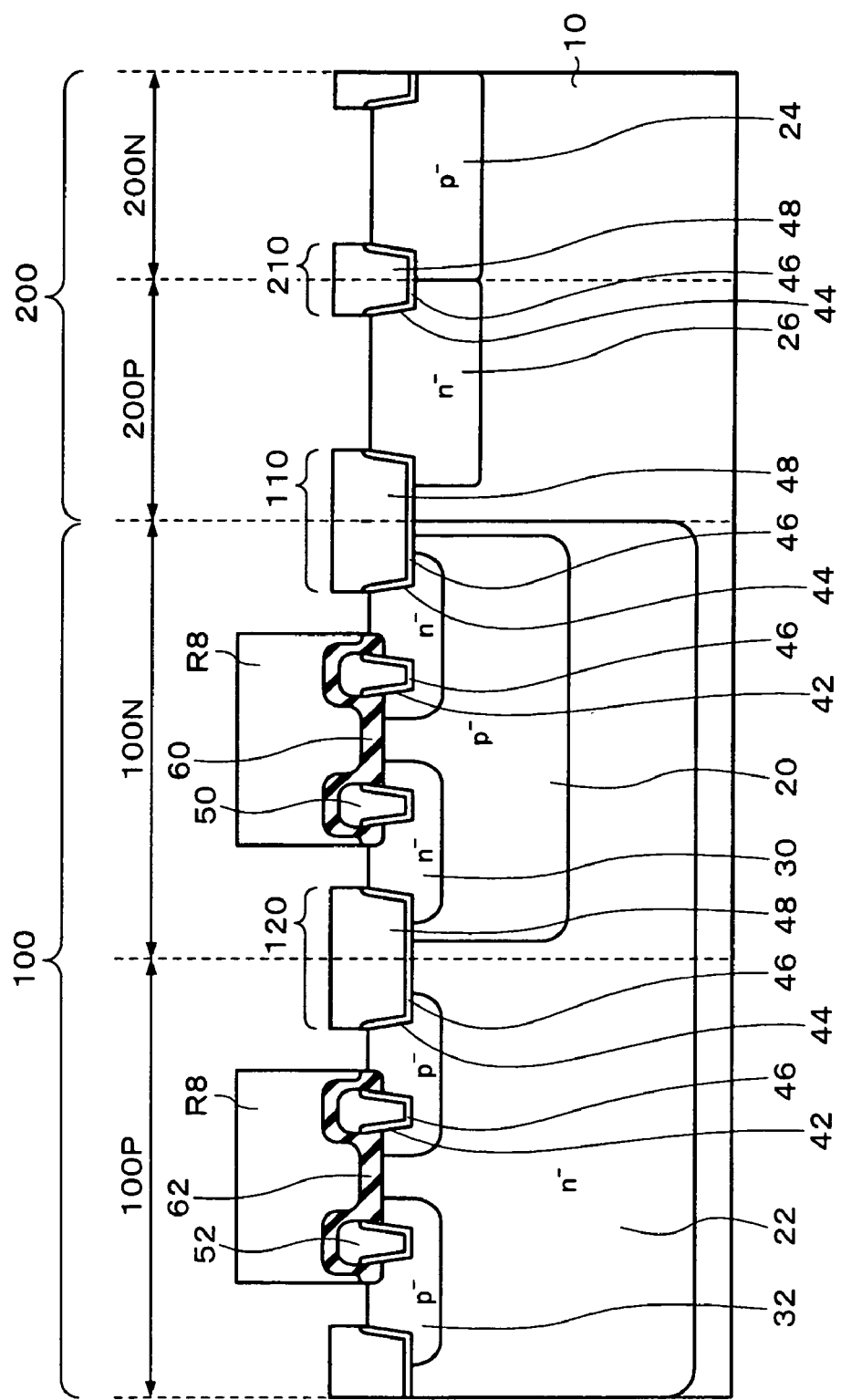
FIG. 18 is a cross-sectional view schematically showing a step in the method for manufacturing a semiconductor device in accordance with the embodiment of the present invention.

(q) Next, as shown in FIG. 18, a resist layer R8 is formed in the high breakdown voltage transistor forming region 100 to cover regions where the first gate dielectric layers 60 and 62 are formed, and the third pad layer 13, that has been exposed, is removed. For instance, the third pad layer 13 can be etched by wet etching with hydrofluoric acid. Then, the resist layer R8 is removed by ashing.

Figure 19:
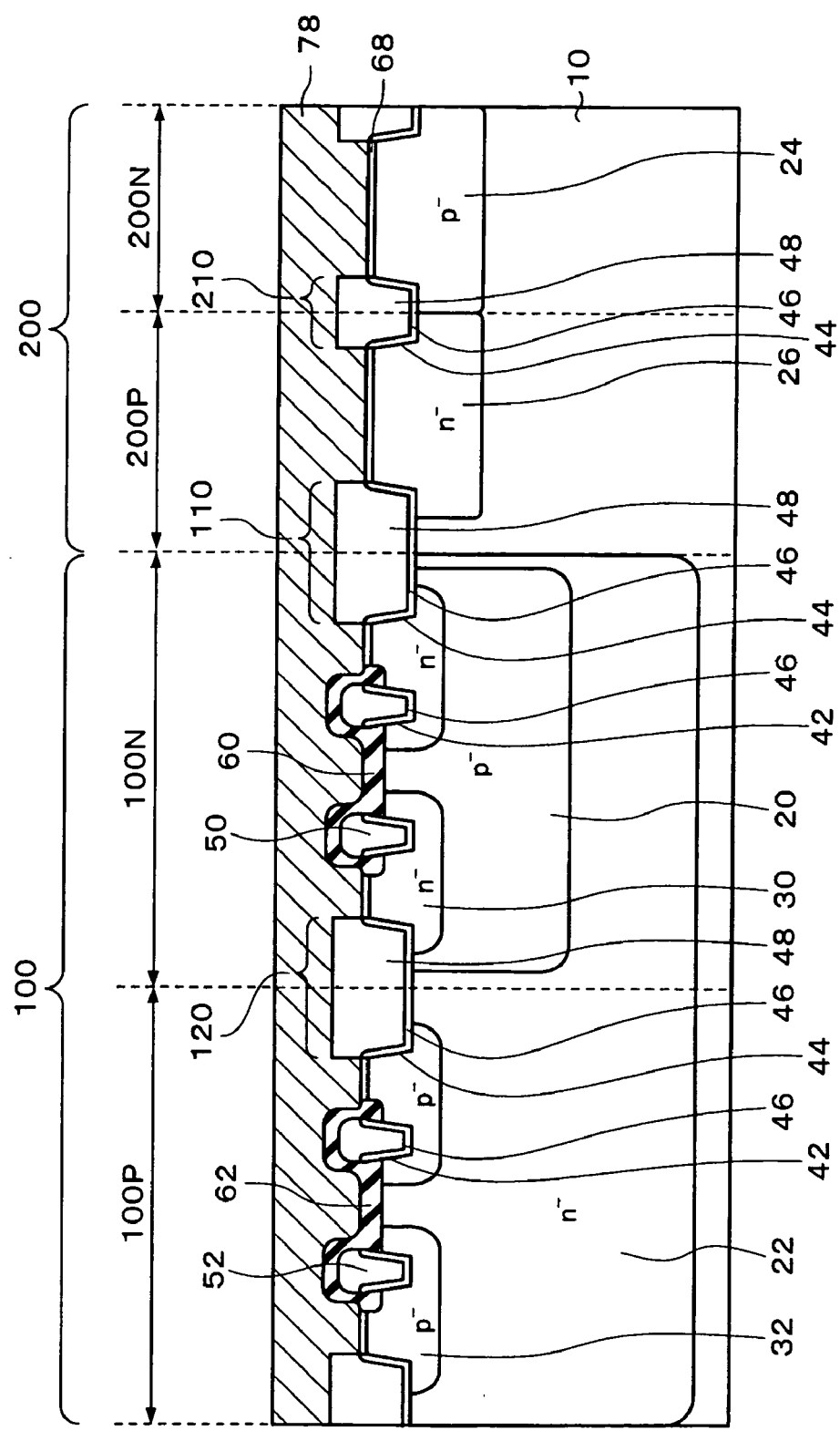
FIG. 19 is a cross-sectional view schematically showing a step in the method for manufacturing a semiconductor device in accordance with the embodiment of the present invention.

(r) Next, a dielectric layer 68 is formed, as shown in FIG. 19. The dielectric layer 68 becomes the gate dielectric layers of the n-type low voltage driving transistors and gate dielectric layers of the p-type low voltage driving transistors. The dielectric layer 68 is formed by, for example, a thermal oxidation method. The film thickness of the dielectric layer 68 is, for example, 1.6–5 nm.

Next, a conductive layer 78 is formed over the entire surface of the high breakdown voltage transistor forming region 100 and the low voltage driving transistor forming region 200. For instance, a polysilicon layer can be used as the conductive layer 78. When polysilicon is used as a material of the conductive layer 78, an impurity can be ion-injected into the conductive layer 78, thereby lowering the resistance of the conductive layer 78.

Figure 20:
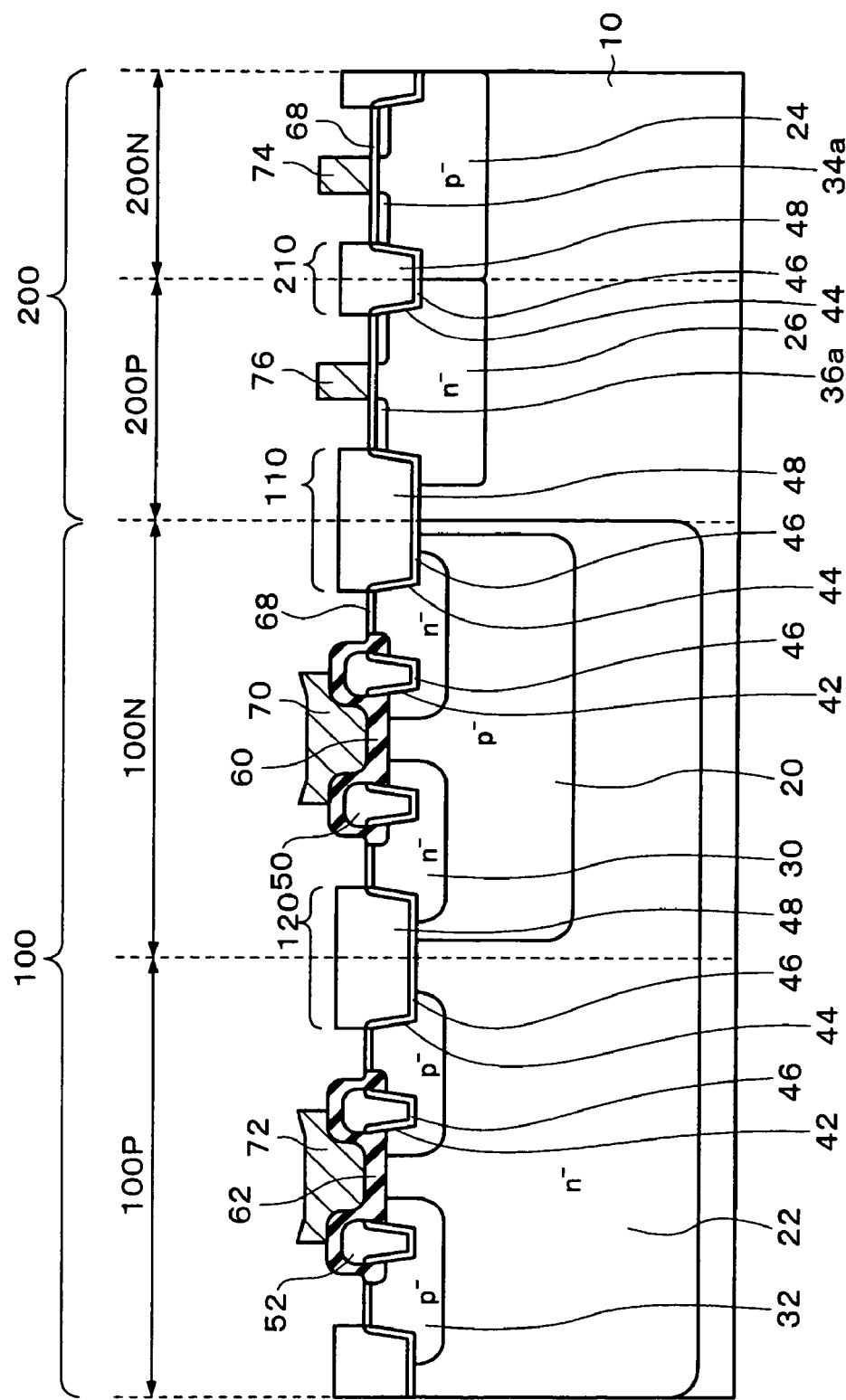
FIG. 20 is a cross-sectional view schematically showing a step in the method for manufacturing a semiconductor device in accordance with the embodiment of the present invention.

(s) Next, gate electrodes 70, 72, 74 and 76 of the respective transistors are formed, as shown in FIG. 20. More specifically, first, a resist layer (not shown) having a predetermined pattern is formed. Then, by using the resist layer as a mask, the conductive layer 78 is patterned, thereby forming the gate electrodes 70, 72, 74 and 76.

Next, impurity layers 34a, which become n-type extension regions, are formed in the n-type low voltage driving transistor forming region 200N. In the p-type low voltage driving transistor forming region 200P, impurity layers 36a which become p-type extension regions are formed. The impurity layers 34a and 36a can be formed by forming a mask layer by using an ordinary lithography technique, and injecting predetermined impurity.

(t) Next, as shown in FIG. 1, a dielectric layer (not shown) is formed over the entire surface, and by anisotropically etching the dielectric layer, sidewall dielectric layers 80, 82, 84 and 86 are formed on side surfaces of the gate electrodes 70, 72, 74 and 76. Further, by etching the gate dielectric layer 68, a gate dielectric layer 64 of the n-type low voltage driving transistor 200n and a gate dielectric layer 66 of the p-type low voltage driving transistor 200p are formed.

Next, by introducing an n-type impurity in predetermined regions of the semiconductor layer 10 in the n-type high breakdown voltage transistor forming region 100N and the n-type low voltage driving transistor forming region 200N, n-type source/drain regions 90 and 94 are formed in the semiconductor layer 10 outside of the sidewall dielectric layers 80 and 84. The n-type source/drain regions 90 and 94 can be formed by a known method.

Next, by introducing a p-type impurity in predetermined regions of the semiconductor layer 10 in the p-type high breakdown voltage transistor forming region 100P and the p-type low voltage driving transistor forming region 200P, p-type source/drain regions 92 and 96 are formed in the semiconductor layer 10 outside of the sidewall dielectric layers 82 and 86. The p-type source/drain regions 92 and 96 can be formed by a known method.

A semiconductor device can be manufactured according to the above-mentioned steps. The following features are provided according to the method for manufacturing the semiconductor device.

According to the method for manufacturing a semiconductor device in accordance with the present embodiment, the process of forming the first wells 20 and 22 and the offset regions 30 and 32 by diffusing impurities of the first impurity layers 20a and 22a and the second impurity layers 30a and 32a by heat treating the semiconductor layer 10 before the process of forming the element isolation regions 110, 120 and 210 by a trench element isolation method. The above-described heat treatment is conducted at a high temperature to make the first wells 20 and 22, and the offset regions 30 and 32 to be deep diffused layers.

After the element isolation regions 110, 120 and 210 are formed, high temperature heat treatments, like the heat treatment necessary for forming the first wells 20 and 22 and the offset regions 30 and 32, do not need to be conducted in accordance with the present manufacturing method. As a result, heat and stress caused by the heat generated at the time of conducting a heat treatment necessary for forming the first wells 20 and 22, and the offset regions 30 and 32, would not be applied to the element isolation regions 110, 120 and 210.

Therefore, the n-type high breakdown voltage transistor 100n, the p-type high breakdown voltage transistor 100p, the n-type low voltage driving transistor 200n, and the p-type low voltage driving transistor 200p can be element-separated by the element isolation regions 110, 120 and 210 with few deformities and defects. In other words, even when a trench element isolation method is used as an element isolation method when high breakdown voltage transistors and low voltage driving transistors are mix-mounted, element isolation regions with an excellent dielectric property can be formed. Also, a semiconductor device can be further miniaturized by using a trench element isolation method, compared to the case in which element isolation regions are formed by using a LOCOS method or a semi recess LOCOS method.

Moreover, by the method for manufacturing a semiconductor device in accordance with the present embodiment, the offset trenches 40 and 42 in the high breakdown voltage transistor forming region 100 can be formed with few deformities and defects for the same reasons as described above. By using the offset trenches 40 and 42 in the high breakdown voltage transistor forming region 100, the high breakdown voltage transistor forming region 100 can be further miniaturized compared to the case in which LOCOS or semi recess LOCOS or the like are used. Furthermore, a semiconductor device can be further miniaturized as a whole.

One example of an embodiment of the present invention is described above. However, the present invention is not limited thereto, and many modifications can be made within the scope of the present invention. For instance, in the present embodiment, an example in which the trenches 44 are formed with the same depth is described, but the trenches can be formed with different depths in a range that carries out their respective functions. For instance, the trench 44 at the first element isolation region 110 can be formed deeper than the trench 44 at the second element isolation region 120 and the offset trenches 40 and 42.

What is claimed is:

1. A method for manufacturing a semiconductor device, comprising:
   a step of forming a first impurity layer that becomes a first well in a high breakdown voltage transistor forming region in a semiconductor layer;
   a step of forming a second impurity layer that becomes an offset region in the high breakdown voltage transistor forming region;
   a step of forming the first well and the offset region by diffusing impurities of the first and second impurity layers by heat treating the semiconductor layer;
   a step of forming an element isolation region by a trench element isolation method in the semiconductor layer, after the step of forming the first well and the offset region;
   a step of forming a first gate dielectric layer in the high breakdown voltage transistor forming region;
   a step of forming a second well in a low voltage driving transistor forming region in the semiconductor layer;
   a step of forming a second gate dielectric layer in the low voltage driving transistor forming region; and
   a step of forming gate electrodes in the high breakdown voltage transistor forming region and the low voltage driving transistor forming region.

2. A method for manufacturing a semiconductor device according to claim 1, wherein the step of forming the element isolation region further comprises a step of simultaneously forming an offset trench dielectric layer in a high breakdown voltage transistor.

3. A method for manufacturing a semiconductor device according to claim 1, wherein n-type and p-type high breakdown voltage transistors are formed in the high breakdown voltage transistor forming region, and n-type and p-type low voltage driving transistors are formed in the low voltage driving transistor forming region.

* * * * *